US008564368B1

(12) United States Patent
Bai

(10) Patent No.: US 8,564,368 B1
(45) Date of Patent: Oct. 22, 2013

(54) DIGITAL PREDISTORTER (DPD) STRUCTURE BASED ON DYNAMIC DEVIATION REDUCTION (DDR)-BASED VOLTERRA SERIES

(75) Inventor: Chunlong Bai, Kanata (CA)

(73) Assignee: Telefonaktiebolaget L M Ericsson, Stockholm (SE)

( * ) Notice: Subject to any disclaimer, the term of this patent is extended or adjusted under 35 U.S.C. 154(b) by 0 days.

(21) Appl. No.: 13/444,547

(22) Filed: Apr. 11, 2012

(51) Int. Cl.
H03F 1/26 (2006.01)
(52) U.S. Cl.
USPC .................. 330/149; 375/297; 455/114.3
(58) Field of Classification Search
USPC ................ 330/149; 375/296, 297; 455/114.3
See application file for complete search history.

(56) References Cited

U.S. PATENT DOCUMENTS

| | | | |
|---|---|---|---|
| 6,683,495 B2 * | 1/2004 | Johnson et al. | 330/52 |
| 6,744,315 B2 * | 6/2004 | Ezuka | 330/149 |
| 7,091,779 B2 * | 8/2006 | Sahlman | 330/149 |
| 7,724,840 B2 * | 5/2010 | McCallister et al. | 375/297 |
| 8,005,162 B2 * | 8/2011 | Cai et al. | 375/296 |
| 8,014,443 B2 * | 9/2011 | Nakamura et al. | 375/232 |
| 8,351,876 B2 * | 1/2013 | McCallister et al. | 455/114.3 |
| 2004/0239429 A1 | 12/2004 | Kermalli | |
| 2009/0302940 A1 | 12/2009 | Fuller et al. | |

FOREIGN PATENT DOCUMENTS

WO  2007117187 A1  10/2007

OTHER PUBLICATIONS

Raich, R. et al. "Orthogonal Polynomials for Power Amplifier Modeling and Predistorter Design." IEEE Transactions on Vehicular Technology, Sep. 2004, pp. 1468-1479, vol. 53, No. 5.
Zhu, A. et al. "Dynamic Deviation Reduction-Based Volterra Behavioral Modeling of RF Power Amplifiers." IEEE Transactions on Microwave Theory and Techniques, Dec. 2006, pp. 4323-4332, vol. 54, No. 12.
Zhu, A. et al. "Open-Loop Digital Predistorter for RF Power Amplifiers Using Dynamic Deviation Reduction-Based Volterra Series." IEEE Transactions on Microwave Theory and Techniques, Jul. 2008, pp. 1524-1534, vol. 56, No. 7.
Telefonaktiebolaget L M Ericsson (publ). "Non-Linear Model with Tap Output Normalization." Filed on Nov. 16, 2010, International Application No. PCT/IB2010/055193, Inventor Bai, C., Not yet published.
Telefonaktiebolaget L M Ericsson (publ). "Orthogonal Basis Function Set for Digital Predistorter." Filed on Nov. 16, 2010, International Application No. PCT/IB2010/055195, Inventor Bai, C., Not yet published.
Telefonaktiebolaget L M Ericsson (publ). "Joint Process Estimator with Variable Tap Delay Line for use in Power Amplifier Digital Predistortion." Filed on Nov. 16, 2010, International Application No. PCT/IB2010/055187, Inventor(s) Bai, C. et al., Not yet published.

(Continued)

Primary Examiner — Patricia Nguyen
(74) Attorney, Agent, or Firm — Coats and Bennett, P.L.L.C.

(57) ABSTRACT

The present invention provides a method an apparatus for predistorting an input signal to compensate for non-linearities in an electronic device that operates on the input signal. The invention may be used, for example, to digitally predistort an input signal for a power amplifier in a wireless communication device. The predistorter uses a polynomial approach based on the well-known Volterra series to model the distortion function. A dynamic deviation reduction technique is used to reduce the number of terms in the distortion model and to facilitate implementation. The approach described herein eliminates square functions present in prior art designs and can be implemented using CORDIC circuits.

26 Claims, 5 Drawing Sheets

(56) References Cited

OTHER PUBLICATIONS

Masood, M., et al., "Behavioral Modeling of High Power RF Amplifiers Using Pruned Volterra Scheme with IIR Basis Functions", IEEE Topical Conference On Power Amplifiers for Wireless And Radio Applications (PAWR), Jan. 16, 2012, pp. 97-100, XP-002699525.

Staudinger, J., "DDR Volterra Series Behavioral Model with Fading Memory and Dynamics for High Power Infrastructure Amplifiers", IEEE Topical Conference On Power Amplifiers For Wireless And Radio Applications (PAWR), Nov. 5, 2011, pp. 61-64, XP-002699526.

* cited by examiner

DIGITAL PREDISTORTER (DPD) STRUCTURE BASED ON DYNAMIC DEVIATION REDUCTION (DDR)-BASED VOLTERRA SERIES

TECHNICAL FIELD

The present invention relates generally to digital predistortion for compensating an input signal for distortion introduced to the input signal by an electronic device and, more particularly, to a digital predistorter structure based on dynamic deviation reduction (DDR)-based Volterra series.

BACKGROUND

The design of radio-frequency power amplifiers for communications applications often involves a trade-off between linearity and efficiency. Power amplifiers are typically most efficient when operated at or near their saturation point. However, the response of the amplifier at or near the point of saturation is non-linear. Generally speaking, when operating in the high-efficiency range, a power amplifier's response exhibits non-linearities and memory effects.

One way to improve a power amplifier's efficiency and its overall linearity is to digitally predistort the input to the power amplifier to compensate for the distortion introduced by the power amplifier. In effect, the input signal is adjusted in anticipation of the distortion to be introduced by the power amplifier, so that the output signal is largely free of distortion products. Generally, the predistortion is applied to the signal digitally, at baseband frequencies, i.e., before the signal is upconverted to radio frequencies.

These techniques can be quite beneficial in improving the overall performance of a transmitter system, in terms of both linearity and efficiency. Furthermore, these techniques can be relatively inexpensive, due to the digital implementation of the predistorter. In fact, with the availability of these techniques, power amplifiers may be designed in view of more relaxed linearity requirements than would otherwise be permissible, thus potentially reducing the costs of the overall system.

SUMMARY

The present invention provides a method an apparatus for predistorting an input signal to compensate for non-linearities in an electronic device that operates on the input signal. The invention may be used, for example, to digitally predistort an input signal for a power amplifier in a wireless communication device. The predistorter uses a polynomial approach based on the well-known Volterra series to model the distortion function. A dynamic deviation reduction technique is used to reduce the number of terms in the distortion model and to facilitate implementation. The approach described herein eliminates square functions present in prior art designs and can be implemented using CORDIC circuits.

Exemplary embodiment of the invention comprise methods of predistorting an input signal to an electronic device that operates on an input signal to generate an output signal. In one exemplary method, a first non-linear component function is applied to a set of first signal samples having different delays to generate a first component signal. A second non-linear component function is applied to a set of second signal samples having different delays to generate a second component signal. The second signal samples comprise conjugates of the first signal samples. The phase of one of the first and second component signals is shifted relative to the other. Following the relative phase shift of the first and second component signals, the first and second component signals are combined to generate a predistorted output signal.

Other embodiments of the invention comprise a predistorter configured predistort an input signal to an electronic device, such as a power amplifier. The predistorter comprises a first component modeling circuit, a second component modeling circuit, a conjugating circuit, a phase-shifting circuit, and a combining circuit. The first component modeling circuit is configured to apply a first non-linear component function to a set of first signal samples having different delays to generate a first component signal. The second component modeling circuit is configured to apply a second non-linear component function to a set of second signal samples having different delays to generate a second component signal. The second signal samples are conjugates of the first signal samples. The phase adjustment circuit is configured to shift the phase of one of the first and second component signals relative to the other. The combining circuit is configured to combine the first and second component signals following the relative phase shift of the first and second component signals to generate a predistorted output signal.

One advantage of the modified V-DDR approach described herein compared to a direct implementation based on the power basis functions is that the dynamic order is consistent across all delayed terms, and provides the full degrees of freedom represented by the dynamic orders. As a result, the modified V-DDR approach can achieve better performance with lower complexity. Also, the predistorter structure based on the modified V-DDR approach avoids square functions, which are required to implement first-order approximations in prior art designs. The modified V-DDR approach can be implemented by a phase-shift, which can be effectively implemented by a CORDIC circuit.

DETAILED DESCRIPTION

Figure 1:
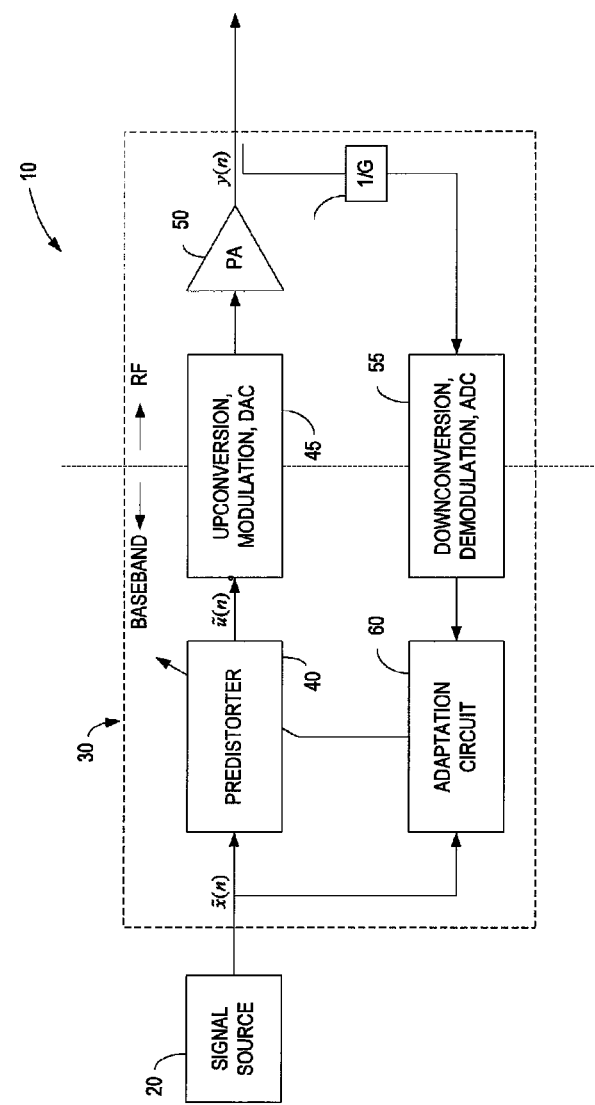
FIG. 1 illustrates an amplifier circuit including a digital predistorter according to embodiments of the present invention.

Referring now to the drawings, FIG. 1 illustrates a wireless terminal 10 for use in a mobile communication network. The wireless terminal 10 includes a signal source 20 that generates a digital signal to be transmitted to a remote device (not shown), and an amplifier circuit 30. The digital signal is applied to the input of the amplifier circuit 30. The amplifier circuit 30 includes a digital predistorter 40, transmitter front-end circuit 45, power amplifier 50, gain adjustment circuit 55, receiver front-end circuit 65, and adaptation circuit 60. The primary purpose of the amplifier circuit 30 is to amplify signals that are being transmitted. The power amplifier 50 is typically most efficient when it is operating in a non-linear range. However, the non-linear response of a power amplifier 50 causes out-of-band emissions and reduces spectral efficiency in a communication system. Therefore, a digital predistorter 40 may be used to improve power amplifier efficiency and linearity by predistorting the input signal to the amplifier circuit 30 to compensate for the non-linear distortion introduced by the power amplifier 50. The cascading of a predistorter 40 and power amplifier 50 improves the linearity of the output signal and thus allows the power amplifier 50 to operate more efficiently. The adaptation circuit 60 may be used to adapt the digital predistorter 40.

Although predistortion is used in the circuits and systems described herein to linearize the output of a power amplifier 50, those skilled in the art will appreciate that the techniques described are more generally applicable to linearize the output of any type of non-linear electronic device.

As seen in FIG. 1, an input signal $\tilde{x}(n)$ to the amplifier circuit 30 is input to the predistorter 40. The predistorter 40 predistorts the input signal $\tilde{x}(n)$ to compensate for the distortion introduced by the power amplifier 50 when the power amplifier 50 is operated in a non-linear range. The predistorted input signal $\tilde{u}(n)$ produced by the predistorter 40 is upconverted, modulated and converted to analog form by the front-end circuit 45 and applied to the input of the power amplifier 50. The power amplifier 50 amplifies the predistorted input signal to produce an output signal y(n). If predistorter 40 is properly designed and configured, then the output signal y(n) contains fewer distortion products and out-of-band emissions than if power amplifier 50 were used alone.

A scaled version of the output signal, referred to as the feedback signal, is fed back to the adaptation circuit 60 to adapt the coefficients of the predistorter 40. Gain adjustment circuit 55 adjusts the gain of the feedback signal. The front-end circuit 65 downconverts, demodulates and converts the feedback signal to digital form for processing by the adaptation circuit 60. The adaption circuit 60 compares the feedback signal with the original input signal $\tilde{x}(n)$ and adjusts the coefficients of the predistorter 40 to minimize the residual distortion products.

The distortion introduced by the predistorter 40 or power amplifier 50 can be represented by a complicated non-linear function, which will be referred to herein as the distortion function. One approach to modeling a distortion function, referred to herein as the polynomial approach, is to represent the distortion function as a set of less complicated basis functions and compute the output of the distortion function as the weighted sum of the basis functions. The set of basis functions used to model the distortion function is referred to herein as the basis function set.

Power amplifier models based on the Volterra series typically have high computational complexity. In Zhu, Anding, et al, *Dynamic Deviation Reduction-Based Volterra Behavioral Modeling of RF Power Amplifiers*, IEEE Transactions on Microwave Theory and Techniques, Vol. 54, No. 12, December 2006, a model order reduction method called dynamic deviation reduction (DDR) is used to significantly reduce the number of terms and thus the computational complexity of a power amplifier model. In this approach, the order of dynamics is explicitly distinguished from the order of non-linearity; the terms in the modified Volterra series are reorganized and the ones with high dynamic orders are removed. With this approach, the number of coefficients increases linearly with the order of non-linearly and memory length. Due to the reduction in complexity, this approach can be used to model a power amplifier.

In Zhu, Anding, Open-Loop Digital Predistorter for RF Power Amplifiers Using Dynamic Deviation Reduction-Based Volterra Series, IEEE Transactions on Microwave Theory and Techniques, Vol. 56, No. 7, July 2008, the V-DDR approach is applied to a digital predistorter. When the dynamic order is limited to the first order, the Volterra series model for a digital predistorter can be expressed as:

$$\tilde{u}(n) = \sum_{k=0}^{\frac{p-1}{2}} \sum_{i=0}^{M} \tilde{g}_{2k+1,1}(i)|\tilde{x}(n)|^{2k} \tilde{x}(n-i) + \sum_{k=0}^{\frac{p-1}{2}} \sum_{i=0}^{M} \tilde{g}_{2k+1,2}(i)|\tilde{x}(n)|^{2(k-1)} \tilde{x}^2(n) \tilde{x}^*(n-i) \quad (0.1)$$

where $\tilde{x}(n)$ and $\tilde{u}(n)$ are the original input and output of the predistorter respectively.

The V-DDR approach represented by Equation (0.1) can be modified as follows:

$$\tilde{u}(n) = \sum_{i=0}^{M} \left[ \sum_{k=0}^{\frac{p-1}{2}} \tilde{g}_{2k+1,1}(i)|\tilde{x}(n)|^{2k} \tilde{x}(n-i) + \sum_{k=0}^{\frac{p-1}{2}} \tilde{g}_{2k+1,2}(i)|\tilde{x}(n)|^{2k} \left(\frac{\tilde{x}(n)}{|\tilde{x}(n)|}\right)^2 \tilde{x}^*(n-i) \right] \quad (0.2)$$

The modifications made to Equation (0.1) to arrive at Equation (0.2) include:
1. The order of summations is reversed
2. The coefficient $\tilde{g}_{2k+1,2}=0$
3. Substitute $$\tilde{x}(n) = |\tilde{x}(n)| \left(\frac{\tilde{x}(n)}{|\tilde{x}(n)|}\right)$$

In Equation (0.2), the terms $$\sum_{k=0}^{\frac{p-1}{2}} \tilde{g}_{2k+1,1}(i)|\tilde{x}(n)|^{2k} \text{ and } \sum_{k=0}^{\frac{p-1}{2}} \tilde{g}_{2k+1,2}(i)|\tilde{x}(n)|^{2k}$$

are non-linear functions expressed as even-order polynomials. These terms can be denoted $f_{i,1,p}(|\tilde{x}(n)|)$ and $f_{i,2,p}(|\tilde{x}(n)|)$ respectively. Equation (0.2) can therefore be rewritten as:

$$\tilde{u}(n) = \sum_{i=0}^{M} f_{i,1,p}(|\tilde{x}(n)|)\tilde{x}(n-i) + \left(\frac{\tilde{x}(n)}{|\tilde{x}(n)|}\right)^2 \sum_{i=0}^{M} f_{i,2,p}(|\tilde{x}(n)|\tilde{x}^*(n-i)) \quad (0.3)$$

Figure 2:
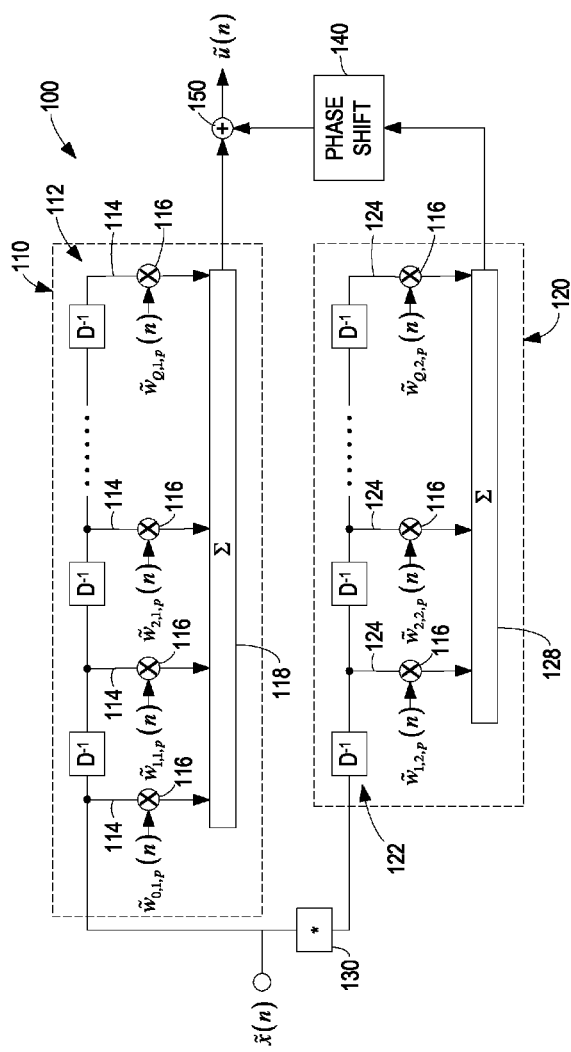
FIG. 2 illustrates a digital predistorter according to one embodiment.

FIG. 2 illustrates the main functional components of a digital predistorter 100 based on the modified V-DDR model given by Equation (0.3), which may be used as the predistorter 40 in FIG. 1. (1.4). The predistorter 100 comprises a first component modeling circuit 110, a second component modeling circuit 120, a conjugating circuit 130, a phase-shifting circuit 140, and a combining circuit 150. The first component modeling circuit 110 applies a first non-linear function to a set of signal samples having different delays to produce a first component signal. The second component modeling circuit 120 applies a second non-linear function to a set of second signal samples having different delays to produce a second component signal. The conjugating circuit 130 computes conjugates of the first signal samples to produce the second signal samples. The phase-shifting circuit 140 shifts the phase of one of the first and second component signals relative to the other. In the exemplary embodiment shown in FIG. 2, the phase-shifting circuit 140 shifts the phase of the second component signal. The combining circuit 150 combines the first component signal with the second component signal after the phase has been shifted to produce a predistorted input signal.

The first component modeling circuit 110 includes a tapped delay line 112 with Q+1 output taps 114, a series of multipliers 116, and a summation circuit 118. The input signal samples are input to the tapped delay line. In the exemplary embodiment, each delay represents a uniform one unit delay, i.e., one sample period. Those skilled in the art will appreciate that more complex implementations may use non-unit and/or non-uniform delays. Multipliers 116 multiply the samples on each output tap 114 by corresponding weighting coefficients. The weighting coefficients are computed for taps 0 through Q according to:

$$\tilde{w}_{i,1,p}(n) = f_{i,1,p}(|\tilde{x}(n)|) \tag{0.4}$$

As will be hereinafter described, the computation of the weighting coefficients may use look-up tables. The summation circuit 118 sums the outputs from the multipliers to produce the first component signal.

The second component modeling circuit 120 includes a tapped delay line 122 with Q output taps 124, a series of multipliers 126, and a summation circuit 128. The weighting coefficient for sample $s_0$ is 0 so no output tap is needed. The conjugation circuit 130 computes the conjugates of the first input signal samples, which are input to the tapped delay line 122. In the exemplary embodiment of FIG. 2, each delay represents a uniform one unit delay, i.e., one sample period. Those skilled in the art will appreciate that more complex implementations may use non-unit and/or non-uniform delays. Multipliers 126 multiply the samples on each output tap 124 by corresponding weighting coefficients. The weighting coefficients are computed for taps 1 through Q (there is no tap 0) according to:

$$\tilde{w}_{i,2,p}(n) = f_{i,2,p}(|\tilde{x}(n)|) \tag{0.5}$$

As will be hereinafter described, the computation of the weighting coefficients may use look-up tables. The summation circuit 128 sums the outputs from the multipliers 126 to produce the second component signal. The phase shifting circuit 140 shifts the phase of the second component signal by:

$$\left(\frac{\tilde{x}(n)}{|\tilde{x}(n)|}\right)^2 \tag{0.6}$$

The summation circuit 150 then adds the shifted second component signal and the first component signal sample-by-sample to produce the predistorted input signal ũ(n).

It is generally desirable to implement a digital predistorter using look-up tables (LUTs). LUT-based implementations are cost effective, but to achieve good performance, a large number of entries to the LUT are needed. As a consequence, a large amount of data is required for training and coefficient configuration. The general predistorter structure 100 shown in FIG. 2 lends itself to implementation using look-up tables (LUTs) as shown in FIG. 3.

The weighting coefficients $\tilde{w}_{i,j,p}(n)$ computed in Equations (1.4) and (1.5) can be adapted by the adaptation circuit 60 to minimize the distortion. When adapting the predistorter 40, the adaptation circuit 60 computes the weighting coefficients $\tilde{w}_{i,j,p}(n)$ for the first and second modeling circuits 110, 120 jointly.

Figure 3:
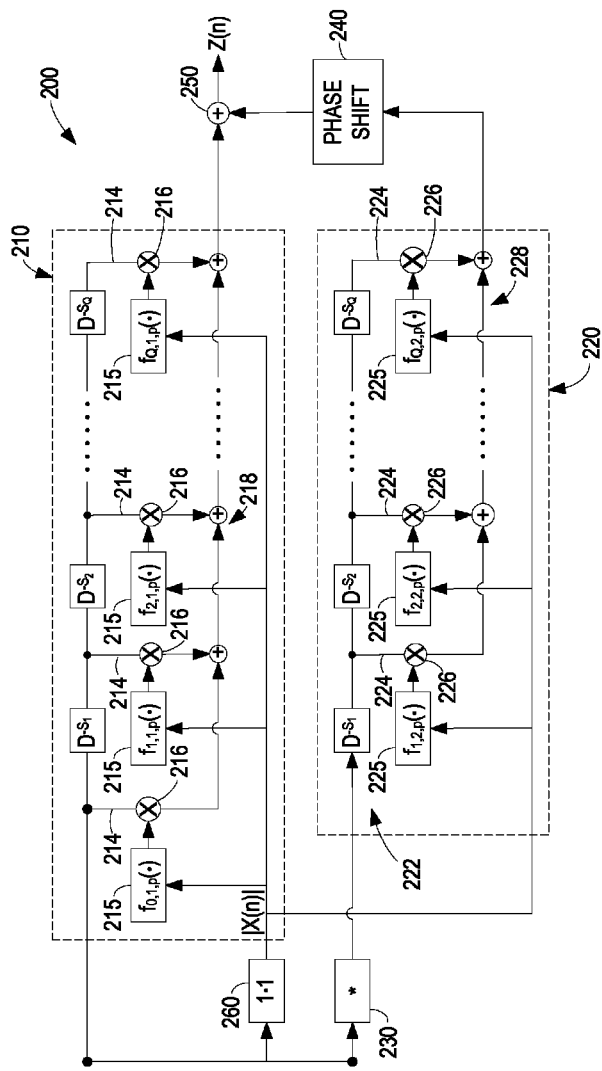
FIG. 3 illustrates a digital predistorter according to one embodiment using look-up tables.

FIG. 3 illustrates a predistorter 200 that may be used as the predistorter 40 in FIG. 1. The predistorter 200 comprises a first component modeling circuit 210, a second component modeling circuit 220, a conjugating circuit 230, a phase-shifting circuit 240, and a combining circuit 250. The first component modeling circuit 210 applies a first non-linear function to a set of first signal samples having different delays to produce a first component signal. The second component modeling circuit 220 applies a second non-linear function to a set of second signal samples having different delays to produce a second component signal. The conjugating circuit 230 computes conjugates of the first signal samples to produce the second component signal. The phase-shifting circuit 240 shifts the phase of one of the first and second component signals relative to the other. In the exemplary embodiment shown in FIG. 3, the phase-shifting circuit 240 shifts the phase of the second component signal. The combining circuit 250 combines the first component signal with the second component signal after the phase has been shifted to produce a predistorted input signal.

The first component modeling circuit 210 includes a tapped delay line 212 with Q+1 output taps 214, a series of multipliers 216, and a summation circuit 218. The input signal samples are input to the tapped delay line 212. In the exemplary embodiment, each delay represents a uniform one unit delay, i.e., one sample period. Those skilled in the art will appreciate that more complex implementations may use non-unit and/or non-uniform delays. Multipliers 216 multiply the samples on their respective output tap 214 by a corresponding weighting coefficient. A LUT unit 215 is used to determine the weighting coefficient to be applied for each output tap 214 based on the current input sample. The summation circuit 218 sums the outputs from the multipliers to produce the first component signal.

The second component modeling circuit 220 includes a tapped delay line 222 with Q output taps 224, a series of multipliers 226, and a summation circuit 228. As noted above, the weighting coefficient for sample $s_0$ is 0 so no output tap is needed. The conjugation circuit 230 computes the conjugates of the first input signal samples, which are input to the tapped delay line 222. In the exemplary embodiment, each delay represents a uniform one unit delay, i.e., one sample period. Those skilled in the art will appreciate that more complex implementations may use non-unit and/or non-uniform delays. Multipliers 226 multiply the samples on each output tap 224 by corresponding weighting coefficients. A LUT unit 225 is used to determine the weighting coefficient to be applied for each output tap 214 based on the current input sample. The summation circuit 228 sums the outputs from the multipliers 226 to produce the second component signal.

The phase shifting circuit 240 shifts the phase of the second component signal according to Equation (0.6). The summation circuit 250 then adds the shifted second component signal and the first component signal sample-by-sample to produce the predistorted input signal ũ(n).

Figure 4:
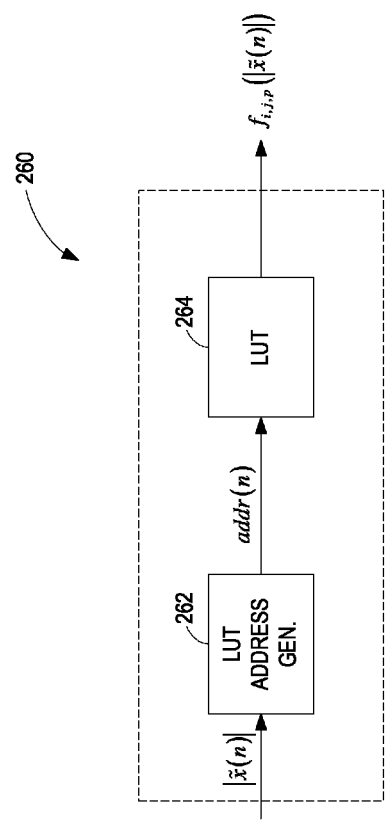
FIG. 4 illustrates implementation of a look-up table for a digital predistorter.

FIG. 4 illustrates an LUT unit 260 for the embodiment illustrated in FIG. 3. The LUT unit 260 may be used to implement the LUT units 215, 225 shown in FIG. 3. The absolute value of the current input sample $\tilde{x}(n)$ is input to the LUT unit 260. The LUT unit 260 includes an address generator 262 and a LUT 264. The LUT 264 stores pre-computed values of the weighting coefficients, which are calculated according to Equations (0.4) and (0.5). The address generator 262 computes an address addr(n) based on the absolute value of the current input sample $\tilde{x}(n)$. The address addr(n) is then used as a index to retrieve one or more pre-computed coefficient values from the LUT 264. The LUT 264 may be implemented as a single table for all weighting coefficients, or as individual tables for each weighting coefficient.

Figure 5:
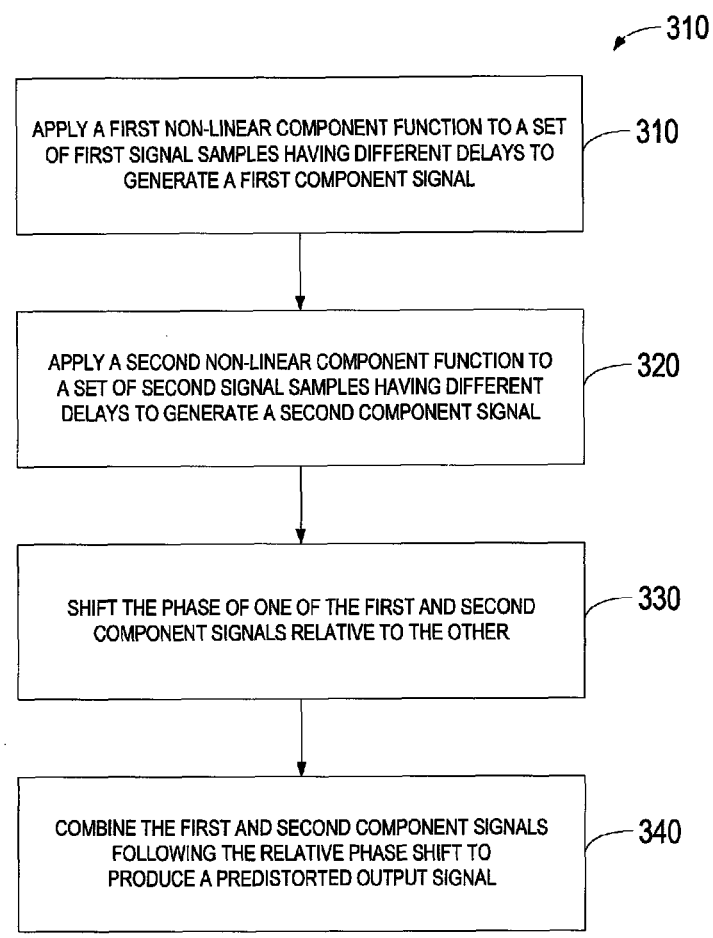
FIG. 5 illustrates an exemplary method of digital predistortion.

FIG. 5 illustrates an exemplary method 300 for predistorting an input signal according to one embodiment of the invention. A first non-linear component function is applied input signal to generate a first component signal (block 310). The first non-linear function operates on a plurality of first signal samples with different delays. A second non-linear function is applied to the conjugate of the input signal to generate a second component signal (block 320). The second non-linear function operates on a plurality of second signal samples with different delays. The second signal samples are conjugates of the first signal samples. The phase of either the first component signal or the second component signal is shifted relative to the other (block 330). The first component signal is then combined with the second component signals to generate the predistorted output signal (block 340). The combining is performed after the phase-shift operation.

One advantage of the modified V-DDR approach described herein compared to a direct implementation based on power basis functions is that the dynamic order is consistent across all delayed terms, and the full degrees of freedom represented by the dynamic orders are provided. As a result, the modified V-DDR approach can achieve better performance with lower complexity. Also, the predistorter structure based on the modified V-DDR approach avoids square functions, which are required to implement first-order approximations in prior art designs. Instead of using square functions, the modified V-DDR approach can be implemented by a phase-shift, which can be effectively implemented by a CORDIC circuit.

The present invention may, of course, be carried out in other specific ways than those herein set forth without departing from the scope and essential characteristics of the invention. The present embodiments are, therefore, to be considered in all respects as illustrative and not restrictive, and all changes coming within the meaning and equivalency range of the appended claims are intended to be embraced therein.

What is claimed is:

1. A method of predistorting an input signal to compensate for non-linearities of an electronic device that operates on the input signal to produce an output signal, the method comprising:
   applying a first non-linear component function to a set of first signal samples having different delays to generate a first component signal;
   applying a second non-linear component function to a set of second signal samples having different delays to generate a second component signal, wherein the second signal samples comprise conjugates of the first signal samples;
   shifting the phase of one of the first and second component signals relative to the other; and
   combining the first and second component signals following the relative phase shift of the first and second component signals to generate a predistorted output signal.

2. The method of claim 1 wherein applying a first non-linear component function to a set of first signal samples comprises:
   determining a weighting coefficient to be applied for each of the first signal samples; and
   multiplying each of the first signal samples by its corresponding weighting coefficient and summing the products to produce the first component signal.

3. The method of claim 2 wherein determining a weighting coefficient to be applied for each of the first signal samples comprises determining the weighting coefficients from a lookup table.

4. The method of claim 3 wherein determining the weighting coefficients from a lookup table comprises:
   computing an address based on one or more of the first signal samples; and
   using the address as an index to one or more lookup tables to determine the weighting coefficients.

5. The method of claim 2 wherein determining a weighting coefficient to be applied for each of the first signal samples comprises determining the weighting coefficient to be applied for each first signal sample based on a power basis function.

6. The method of claim 2 wherein determining a weighting coefficient to be applied for each of the first signal samples comprises determining the weighting coefficient to be applied for each first signal sample based on an orthogonal basis function.

7. The method of claim 1 wherein applying a second non-linear component function to a set of second signal samples comprises:
   determining a weighting coefficient to be applied for each of the second signal samples; and
   multiplying each of the second signal samples by its corresponding weighting coefficient and summing the products to produce the second component signal.

8. The method of claim 7 wherein determining a weighting coefficient to be applied for each of the second signal samples comprises determining the weighting coefficients from a lookup table.

9. The method of claim 8 wherein determining the weighting coefficients from a lookup table comprises:
   computing an address based on one or more of the second signal samples; and
   using the address as an index to one or more lookup tables to determine the weighting coefficients.

10. The method of claim 7 wherein determining a weighting coefficient to be applied for each of the second signal samples comprises determining the weighting coefficient to be applied for each second signal sample based on a power basis function.

11. The method of claim 7 wherein determining a weighting coefficient to be applied for each of the second signal samples comprises determining the weighting coefficient to be applied for each second signal sample based on an orthogonal basis function.

12. The method of claim 1 wherein the first and second non-linear component functions are applied to uniformly spaced signal samples with non-unit delays between adjacent samples.

13. The method of claim 1 wherein the first and second non-linear component functions are applied to non-uniformly spaced signal samples.

14. A predistorter for predistorting an input signal to an electronic device to compensate for non-linearities of the electronic device, the predistorter comprising:
   a first component modeling circuit configured to apply a first non-linear component function to a set of first signal samples having different delays to generate a first component signal;
   a second component modeling circuit configured to apply a second non-linear component function to a set of second signal samples having different delays to generate a second component signal, wherein the second signal samples comprise conjugates of the first signal samples;

a phase adjustment circuit configured to shift the phase of one of the first and second component signals relative to the other; and a combining circuit configured to combine the first and second component signals following the relative phase shift of the first and second component signals to generate a predistorted output signal.

15. The predistorter of claim 14 wherein the first component modeling circuit is configured to:

determine a weighting coefficient to be applied for each of the first signal samples; and multiply each of the first signal samples by its corresponding weighting coefficient and sum the products to produce the first component signal.

16. The predistorter of claim 15 wherein the first component modeling circuit is configured to determine the weighting coefficients from a lookup table.

17. The predistorter of claim 16 wherein the first component modeling circuit is configured to:

compute an address based on one or more of the first signal samples; and use the address as an index to one or more lookup tables to determine the weighting coefficients.

18. The predistorter of claim 16 wherein the first component modeling circuit is configured to determine the weighting coefficients to be applied for each first signal sample based on a power basis function.

19. The predistorter of claim 16 wherein the first component modeling circuit is configured to determine the weighting coefficients for each first signal sample based on an orthogonal basis function.

20. The predistorter of claim 14 wherein the second component modeling circuit is configured to:

determine a weighting coefficient to be applied for each of the second signal samples; and multiply each of the second signal samples by its corresponding weighting coefficient and summing the products to produce the second component signal.

21. The predistorter of claim 20 wherein the second component modeling circuit is configured to determine the weighting coefficients from a lookup table.

22. The predistorter of claim 21 wherein the second component modeling circuit is configured to:

compute an address based on one or more of the second signal samples; and use the address as an index to one or more lookup tables to determine the weighting coefficients.

23. The predistorter of claim 20 wherein the second component modeling circuit is configured to determine the weighting coefficients to be applied for each second signal sample based on a power basis function.

24. The predistorter of claim 20 wherein the second component modeling circuit is configured to determine the weighting coefficients to be applied for each second signal sample based on an orthogonal basis function.

25. The predistorter of claim 14 wherein the first and second component modeling circuits are configured to apply the first and second non-linear component functions to uniformly spaced signal samples with non-unit delays between adjacent samples.

26. The predistorter of claim 14 wherein the first and second component modeling circuits are configured to apply the first and second non-linear component functions to non-uniformly spaced signal samples.

* * * * *

UNITED STATES PATENT AND TRADEMARK OFFICE
CERTIFICATE OF CORRECTION

| | | |
|---|---|---|
| PATENT NO. | : 8,564,368 B1 | Page 1 of 1 |
| APPLICATION NO. | : 13/444547 | |
| DATED | : October 22, 2013 | |
| INVENTOR(S) | : Bai | |

It is certified that error appears in the above-identified patent and that said Letters Patent is hereby corrected as shown below:

On the Title Page

Item (73), under "Assignee", in Column 1, Lines 1-2, delete "Ericsson," and insert
-- Ericsson (publ), --, therefor.

Item (57), under "ABSTRACT", in Column 2, Line 1, delete "method an apparatus" and
insert -- method and apparatus --, therefor.

In the Specification

In Column 1, Line 45, delete "method an apparatus" and insert -- method and apparatus --, therefor.

Signed and Sealed this
Fifteenth Day of July, 2014

Michelle K. Lee
*Deputy Director of the United States Patent and Trademark Office*